(12) United States Patent
Morin et al.

(10) Patent No.: US 10,103,174 B2
(45) Date of Patent: Oct. 16, 2018

(54) SEMICONDUCTOR-ON-INSULATOR (SOI) DEVICE AND RELATED METHODS FOR MAKING SAME USING NON-OXIDIZING THERMAL TREATMENT

(71) Applicant: STMICROELECTRONICS, INC., Coppell, TX (US)

(72) Inventors: Pierre Morin, Albany, NY (US); Qing Liu, Irvine, CA (US); Nicolas Loubet, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 49 days.

(21) Appl. No.: 14/964,648

(22) Filed: Dec. 10, 2015

(65) Prior Publication Data

US 2016/0093639 A1 Mar. 31, 2016

Related U.S. Application Data

(62) Division of application No. 14/050,576, filed on Oct. 10, 2013, now Pat. No. 9,236,380.

(51) Int. Cl.
| | |
|---|---|
| *H01L 27/092* | (2006.01) |
| *H01L 27/12* | (2006.01) |
| *H01L 21/84* | (2006.01) |
| *H01L 29/06* | (2006.01) |
| *H01L 29/16* | (2006.01) |
| *H01L 29/161* | (2006.01) |
| *H01L 21/8238* | (2006.01) |

(52) U.S. Cl.
CPC .......... *H01L 27/1203* (2013.01); *H01L 21/84* (2013.01); *H01L 27/092* (2013.01); *H01L 29/0649* (2013.01); *H01L 29/16* (2013.01); *H01L 29/161* (2013.01); *H01L 21/823807* (2013.01); *H01L 21/823878* (2013.01)

(58) Field of Classification Search
None
See application file for complete search history.

(56) References Cited

U.S. PATENT DOCUMENTS

| | | | |
|---|---|---|---|
| 8,482,070 B1 | 7/2013 | Flatresse et al. | |
| 2006/0042542 A1* | 3/2006 | Bedell | H01L 21/76254 117/105 |
| 2006/0214257 A1 | 9/2006 | Ninomiya et al. | |
| 2007/0108481 A1* | 5/2007 | Thean | H01L 27/1203 257/288 |
| 2010/0047985 A1* | 2/2010 | Dakshina Murthy et al. | H01L 21/26513 438/303 |
| 2013/0193514 A1* | 8/2013 | Loubet | H01L 21/84 257/347 |
| 2014/0011328 A1 | 1/2014 | Bedell et al. | |

(Continued)

*Primary Examiner* — Daniel Whalen
(74) *Attorney, Agent, or Firm* — Seed Intellectual Property Law Group LLP

(57) ABSTRACT

A method for making a semiconductor device may include forming, on a first semiconductor layer of a semiconductor-on-insulator (SOI) wafer, a second semiconductor layer comprising a second semiconductor material different than a first semiconductor material of the first semiconductor layer. The method may further include performing a thermal treatment in a non-oxidizing atmosphere to diffuse the second semiconductor material into the first semiconductor layer, and removing the second semiconductor layer.

21 Claims, 6 Drawing Sheets

(56) References Cited

U.S. PATENT DOCUMENTS

2014/0175543 A1    6/2014  Glass et al.
2014/0339638 A1*  11/2014  Cheng ................ H01L 27/1203
                                                257/347

* cited by examiner

SEMICONDUCTOR-ON-INSULATOR (SOI) DEVICE AND RELATED METHODS FOR MAKING SAME USING NON-OXIDIZING THERMAL TREATMENT

JOINT RESEARCH AGREEMENT

The subject matter claimed herein was made as a result of activities undertaken with the scope of a joint research agreement. The parties to the joint research agreement are () STMicroelectronics, Inc., and (2) International Business Marchines Corporation.

FIELD OF THE INVENTION

The present invention relates to the field of electronic devices and, more particularly, to semiconductor devices and related methods.

BACKGROUND OF THE INVENTION

Some semiconductor devices utilize semiconductor-on-insulator (SOI) technology, in which a thin layer of a semiconductor (typically having a thickness of a few nanometers), such as silicon, is separated from a semiconductor substrate by a relatively thick electrically insulating layer (typically featuring a thickness of a few tens of nanometers). Integrated circuits using SOI technology offer certain advantages compared to traditional "bulk" technology for Complementary Metal Oxide Semiconductor (CMOS) integrated circuits. For example, SOI integrated circuits typically provide a lower power consumption for a same performance level.

SOI circuits may also feature a reduced stray capacitance, allowing an increase of commutation speeds. Furthermore, the latch-up phenomena encountered in bulk technology may be mitigated. Such circuits are commonly used in System on Chip (SoC) and Micro electro-mechanical systems (MEMS) applications. SOI circuits may also be less sensitive to ionizing radiations, making them more reliable than bulk-technology circuits in applications where radiation may induce operating problems (e.g., aerospace applications). SOI integrated circuits may include memory components such as Static Random Access Memory (SRAM), as well as logic gates.

One SOI implementation is for enhanced scaling in Ultra-thin Body and BOX (UTBB), or UTBOX, devices. UTBB cells may include an NMOS transistor and a PMOS transistor, both formed in the thin silicon layer which overlies the buried insulating oxide layer. One example UTBOX integrated circuit is disclosed in U.S. Pat. No. 8,482,070 to Flatresse et al., which is hereby incorporated herein in its entirety by reference. The integrated circuit has cells placed in a cell row having a PMOS transmitter including a ground beneath the PMOS transmitter, and an n-doped well beneath the ground and configured to apply a potential thereto. An NMOS transmitter includes a ground beneath the NMOS transmitter, and a p-doped well beneath the ground and configured to apply a potential thereto.

Despite the existence of such configurations, further enhancements in SOI or UTBB devices may be desirable in some applications.

SUMMARY OF THE INVENTION

A method for making a semiconductor device may include forming, on a first semiconductor layer of a semiconductor-on-insulator (SOI) wafer, a second semiconductor layer comprising a second semiconductor material different than a first semiconductor material of the first semiconductor layer. The method may further include performing a thermal treatment in a non-oxidizing atmosphere to diffuse the second semiconductor material into the first semiconductor layer, and removing the second semiconductor layer.

More particularly, removing the second semiconductor layer may comprise removing the second semiconductor layer using a wet etch. Furthermore, performing the thermal treatment may comprise performing the thermal treatment to provide a non-linear diffusion profile of the second semiconductor material within the first semiconductor layer.

In one example embodiment, a thermal treatment may also be performed in an oxidizing atmosphere prior to removing the second semiconductor layer. More particularly, performing the thermal treatment in the non-oxidizing atmosphere may be for a shorter duration than performing the thermal treatment in the oxidizing atmosphere. Additionally, performing the thermal treatment in the non-oxidizing atmosphere may be at a higher temperature than performing the thermal treatment in the oxidizing atmosphere.

By way of example, performing the thermal treatment may comprise performing the thermal treatment in the non-oxidizing atmosphere for 50 seconds or less. Also by way of example, performing the thermal treatment may comprise performing the thermal treatment in the non-oxidizing atmosphere at a temperature of 1000° C. or less.

The method may further include forming a nitride layer overlying the second semiconductor layer prior to performing the thermal treatment in the non-oxidizing atmosphere. The second semiconductor material may comprise germanium, and the first semiconductor material may comprise silicon, for example. The method may also include forming source and drain regions defining a channel in the first layer after the diffusion of the second semiconductor material therein, and forming a gate above the channel. By way of example, the SOI wafer may comprise an ultra-thin body and buried oxide (UTBB) wafer.

A related semiconductor device may include a semiconductor substrate, and an n-channel metal-oxide semiconductor field-effect transistor (NMOS) comprising a first buried oxide (BOX) layer on the semiconductor substrate, a first semiconductor layer on the first BOX layer, a first pair of source and drain regions defining an n-type channel therebetween in the first semiconductor layer, and a first gate above the n-type channel. The semiconductor device may further include a p-channel MOSFET (PMOS) including a second BOX layer on the semiconductor substrate, a second semiconductor layer on the second BOX layer, a second pair of source and drain regions defining an p-type channel therebetween in the second semiconductor layer, and a second gate above the p-type channel. A shallow trench isolation (STI) region may be between the NMOS and the PMOS. Furthermore, the second BOX layer may have a planar upper surface devoid of oxide protrusions adjacent the STI region.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 9:
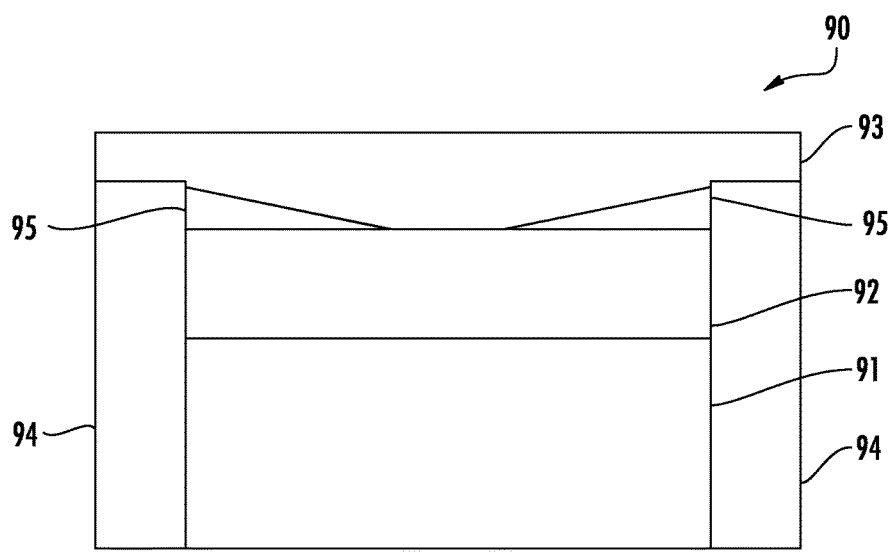
FIG. 9 is a cross-sectional diagram of a PMOS cell of a prior art SOI device.

By way of background, one potential problem that may arise with SOI devices, and more particularly UTBB devices, is that the BOX thickness may be undesirably increased during the silicon germanium p-channel formation using typical condensation techniques. Referring more particularly to FIG. 9, a partially completed PMOS cell 90 of a UTBB device formed using conventional techniques is shown. The PMOS cell 90 illustratively includes a substrate 91, a BOX layer 92 on the substrate, an SiGe channel layer 93 on the BOX layer, and shallow trench isolation (STI) regions 94 which insulate the PMOS cell from adjacent cells. Typically, the silicon germanium channel layer 93 is formed by depositing a germanium-rich layer above the thin silicon layer of the UTBB wafer, and then performing a rapid thermal oxidation (RTO) at a sufficiently high temperature (e.g., 1050° C. or higher) to cause germanium condensation into the thin silicon layer. This is done for a given time to oxidize an appropriate depth of material, which is in turn removed to provide the desired channel thickness.

Yet, one difficulty which may arise when performing germanium condensation using the RTO in this manner is that the BOX layer 92 also oxidizes, leaving undesirable protrusions or wedges of oxidation 95 that create a non-uniform thickness of the BOX layer. These additional oxidation regions 95 tend to be more pronounced adjacent the STI regions 94, as shown. This variation in the thickness of the BOX layer 92 may undesirably impact the threshold voltage, $V_T$, of the device. For example, a 1 nm growth of the BOX layer 92 results in an approximate 10 mV increase in the threshold voltage for next generation devices (e.g., 15-20 nm BOX thicknesses).

Figure 1:
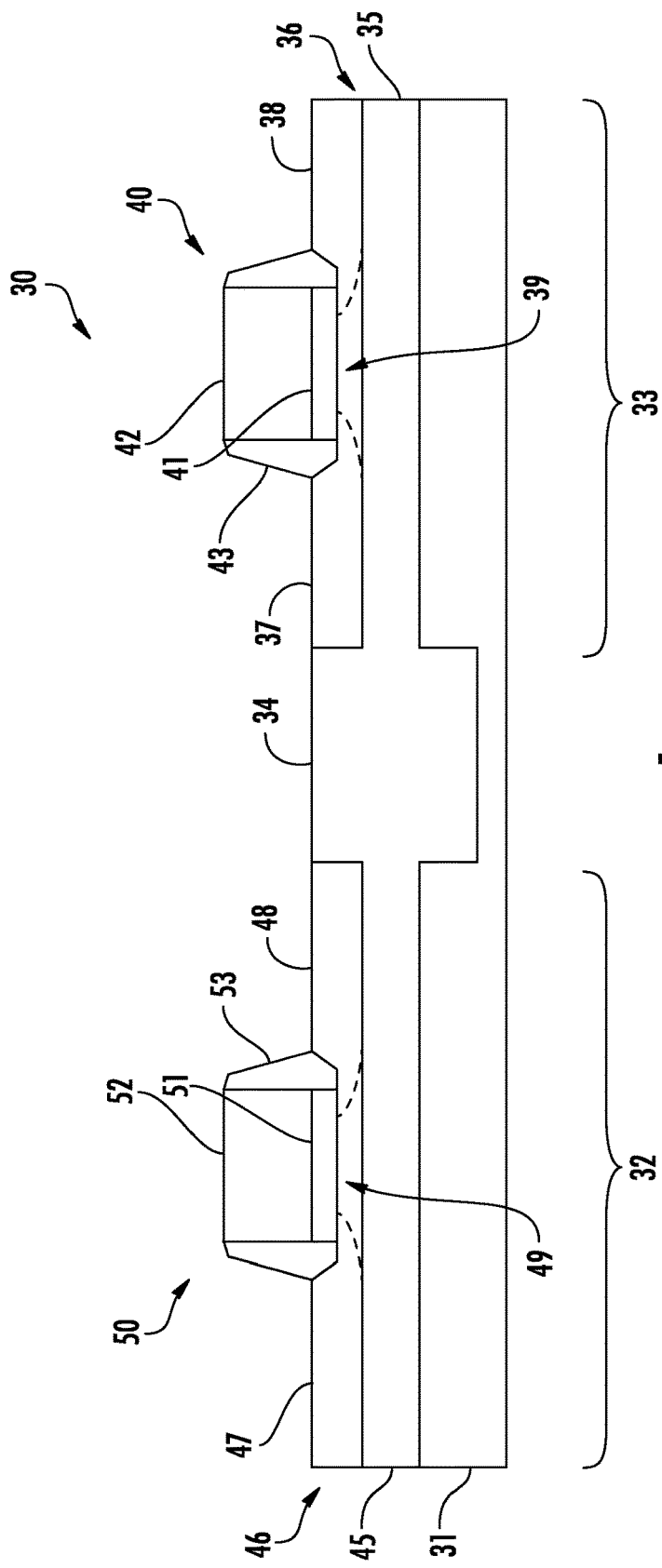
FIG. 1 is cross-sectional diagram of a semiconductor device in accordance with an example embodiment.

Referring now to FIG. 1, a semiconductor device 30 is first described. In the illustrated example, the semiconductor device 30 is a UTBB CMOS device, although other types of devices and SOI configurations may also be provided using the techniques set forth herein. The semiconductor device 30 illustratively includes a substrate 31 (e.g., silicon) with a PMOS transmitter 32 and an NMOS transmitter 33 thereon, which are separated by an STI region 34. The NMOS transmitter 33 includes a first BOX layer 35 on the substrate 31, a first semiconductor layer 36 on the first BOX layer, a first pair of source and drain regions 37, 38 defining an n-type channel 39 therebetween in the first semiconductor layer, and a first gate 40 above the n-type channel. The gate 40 illustratively includes a gate dielectric layer 41, a gate electrode layer 42, and sidewall spacers 43, as will be appreciated by those skilled in the art.

The PMOS 32 illustratively includes a second BOX layer 45 on the semiconductor substrate 31, a second semiconductor layer 46 on the second BOX layer, a second pair of source and drain regions 47, 48 defining a p-type channel 49 therebetween in the second semiconductor layer, and a second gate 50 above the p-type channel. The gate 40 illustratively includes a gate dielectric layer 51, a gate electrode layer 52, and sidewall spacers 53. As will be discussed further below, the second BOX layer 45 may have a planar upper surface devoid of oxide protrusions adjacent the STI region 34.

Figure 2:
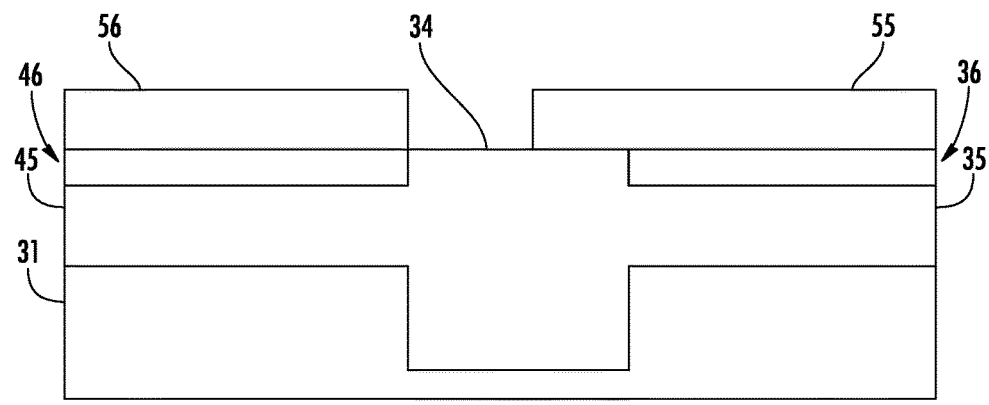
FIGS. 2-4 are a series of cross-sectional diagrams illustrating an example method of making the semiconductor device of FIG. 1.
Figure 3:
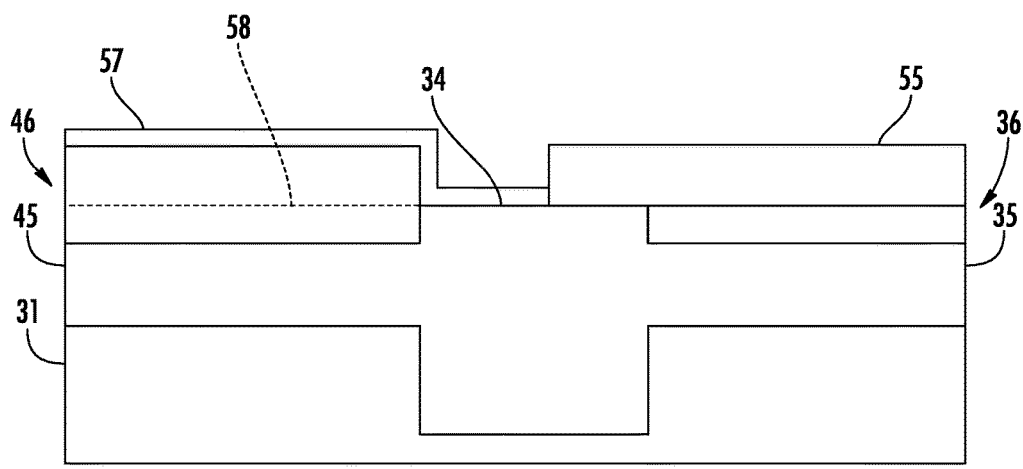
Figure 4:
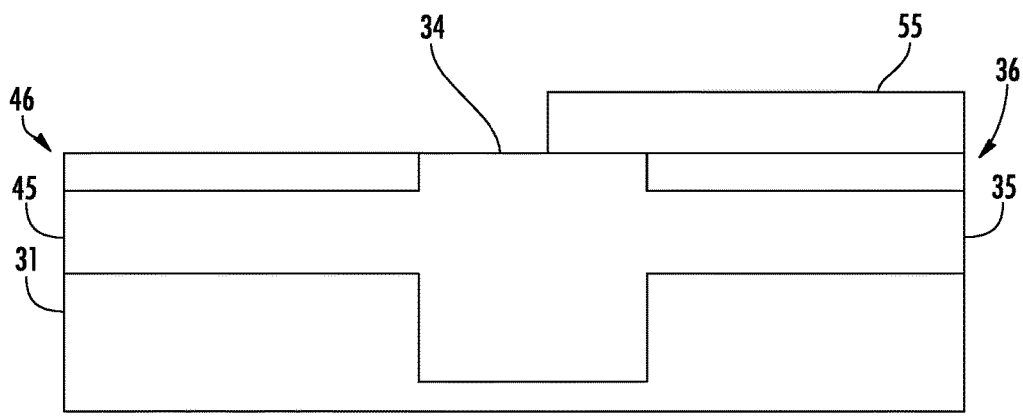

One example method for making the semiconductor device 30 is now described with reference to FIGS. 2-4. A nitride (mask) layer 55 is formed over the NMOS region (the right half of FIG. 2) on a UTBB wafer to protect the NMOS during formation of the SiGe channel layer on the PMOS region. To this end, an SiGe layer 56 is grown on the second semiconductor layer 46 (e.g., silicon on a silicon UTBB wafer). In the present example, the SiGe layer 56 has a concentration of about 40% germanium, although other concentrations may be used in different embodiments, as will be discussed further below.

Figure 2A:
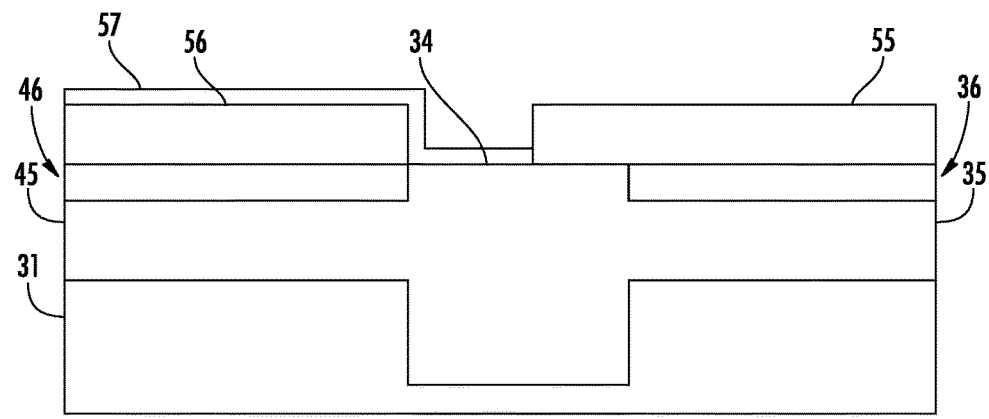

An optional nitride liner 57 may be deposited overlying the SiGe layer 56 prior to heat treating (FIG. 2A), which may help reduce germanium loss, although the nitride liner need not be used in all embodiments. A rapid thermal anneal (RTA) step is then performed to cause diffusion of the germanium from the SiGe layer 56 into the second silicon layer 46. More particularly, in the present embodiment, the RTA step replaces the above-described RTO condensation process and instead causes diffusion of the germanium from the SiGe layer 56 into the second silicon layer 46 in a non-oxidizing (or un-oxidized) atmosphere, as will be appreciated by those skilled in the art. By way of example, an example non-oxidizing atmosphere may have less than ten parts-per-million (PPM) of oxygen atoms therein. The original boundary between the second silicon layer 46 and the SiGe layer 56 is indicated by a dashed line 58.

Besides being performed in a non-oxidizing atmosphere, the RTA may also be performed at a relatively lower temperature, which also helps prevent any further oxidation of the second BOX layer 45 if any stray oxygen were present. For example, the RTA may be performed at a temperature of 1000° C. for 90 seconds, although other temperatures and times may be used in different embodiments.

Figure 5:
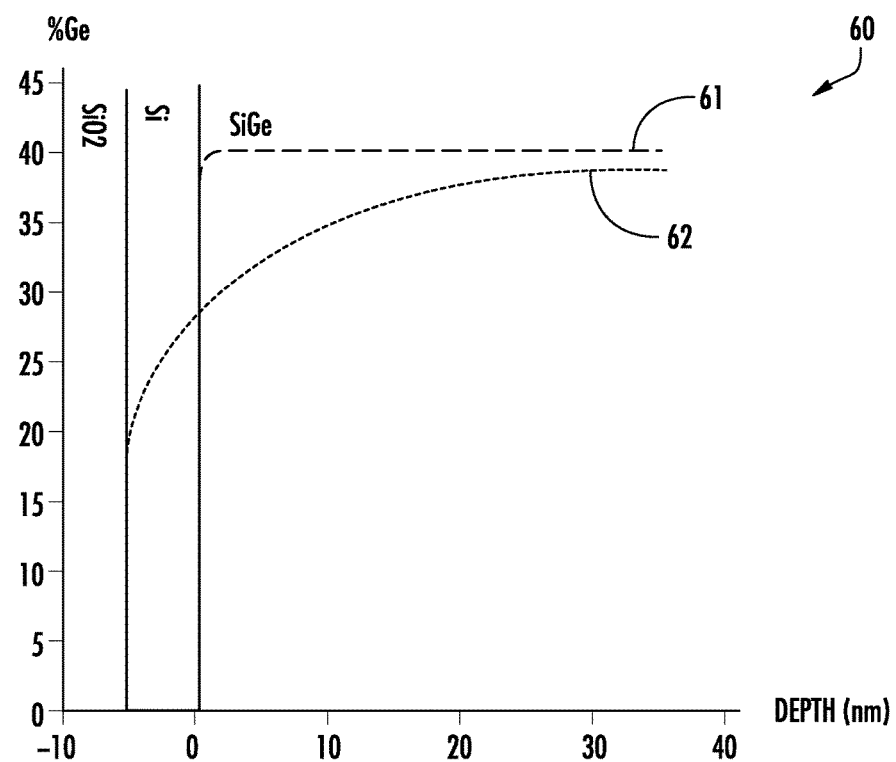
FIG. 5 is a graph illustrating depth vs. percent concentration for germanium within a PMOS device formed using the method of FIGS. 2-4.

While the typical RTO process may undesirably add unwanted oxidation to the second BOX layer 45, one advantage of RTO processing is that it is relatively easy to control the depth of oxidation (and therefore the final thickness of the second semiconductor layer 46), and it provides a relatively smooth upper surface to the second semiconductor layer. With the RTA processing, a wet etch (e.g., SC1, etc.) may instead be used to pattern the second semiconductor layer 46 to the desired thickness, which may ordinarily be more difficult to control in terms of depth and smoothness of the second semiconductor layer 46 upper surface. To provide enhanced control of the etching, the initial quantity of germanium in the SiGe layer 56, as well as the temperature and duration of the anneal, may be selected to provide a non-linear diffusion profile of germanium in the second semiconductor layer 46, as will be understood further with respect to the simulated germanium profiles shown in the graph 60 of FIG. 5. In accordance with one example wet etching process, an SC1 clean may be performed with a 1:1:5 solution of NH$_4$OH (ammonium hydroxide 27%)+H$_2$O$_2$ (hydrogen peroxide 30%)+H$_2$O (water) at 75 to 80° C. This allows for etching of the SiGe with an etch rate that depends on the Ge concentration present. That is, the more Ge that is present, the higher the etch rate.

In the illustrated example, a first plot line 61 represents the concentration of germanium in the SiGe layer 56 prior to the RTA. The SiGe layer 56 has a thickness of 35 nm (X-axis), and a liner or uniform concentration of 40% germanium (Y-axis) throughout. There is no germanium in the second semiconductor (i.e., silicon) layer 46, which extends from 0 to −5 nm in the illustrated example), and the second BOX layer 45 (SiO$_2$) extends from −5 nm to −10 nm in the graph 60.

The second plot line 62 is a modeled non-linear profile of the germanium within the SiGe layer 56 and the second semiconductor layer 46 after 90 seconds of RTA at a temperature of 1000° C. This creates a germanium concentration of about 27% at the Si/SiGe layer interface, and about 21% at the Si/SiO$_2$ interface. As such, by selecting an appropriate etch formulation and time, etching can be performed to the desired depth, i.e., where the germanium concentration is about 27% in the present example, to thereby provide the desired thickness for the second semiconductor layer 46. The germanium within the second semiconductor layer 46 will typically be distributed evenly (i.e., with a liner distribution profile) during later thermal processing (e.g., gate oxide 51 formation, etc.), providing a density of about 25% germanium throughout the second semiconductor layer 46. However, it will be appreciated that other starting and finishing concentrations of germanium may be used in different embodiments.

Once etching has been performed to provide the desired depth for the second semiconductor layer 46 (FIG. 4), the protective nitride layer 55 may be removed and further processing steps may be performed to provide the structure shown in FIG. 1, as will be appreciated by those skilled in the art.

Figure 6:
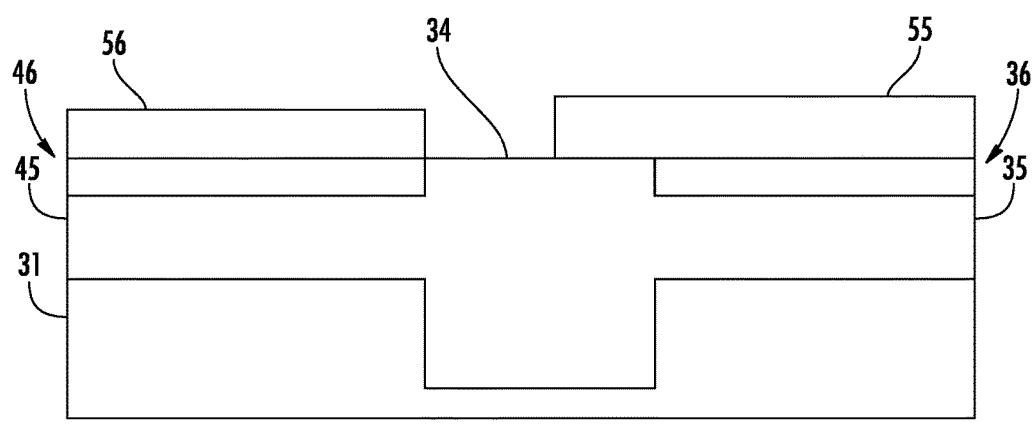
FIGS. 6, 6A, 7, and 8 are a series of cross-sectional diagrams illustrating another example method of making a semiconductor device.
Figure 6A:
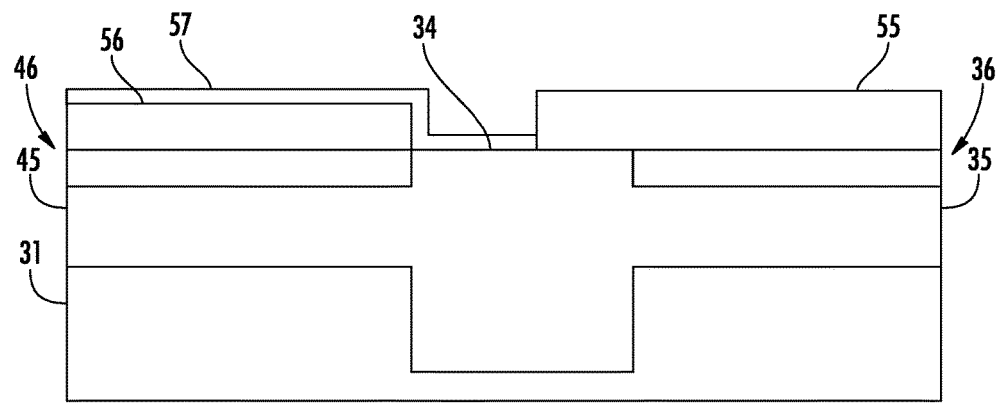
Figure 7:
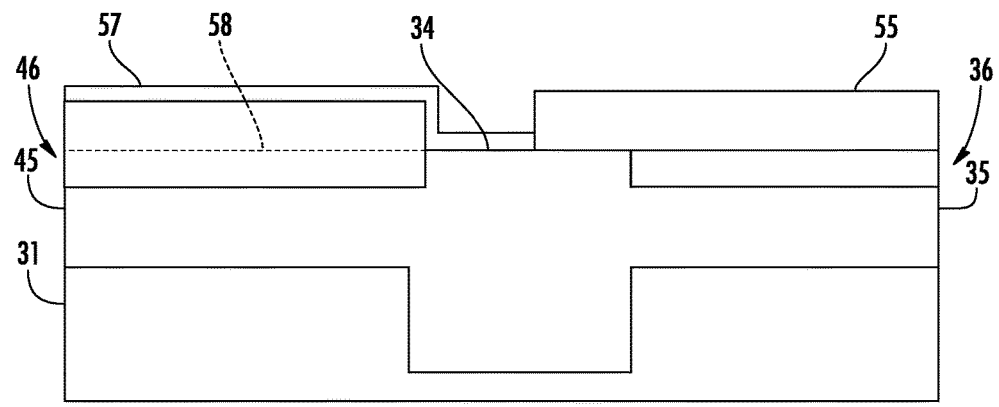
Figure 8:
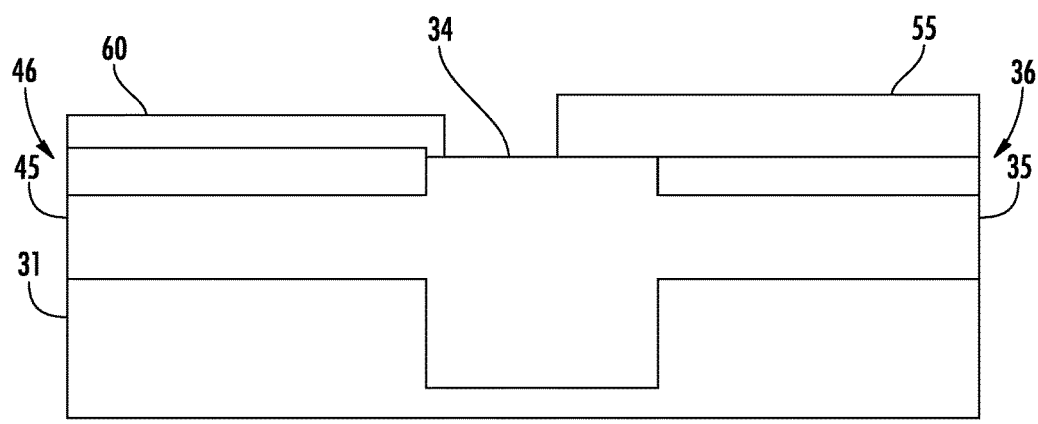

Turning to FIGS. 6-8, another process for making the semiconductor device 30 is now described. In this approach, the conventional high-temperature RTO condensation approach described above with reference to FIG. 9 is instead replaced by a first RTA diffusion step in a non-oxidizing atmosphere, followed by a subsequent lower temperature RTO condensation step in an oxidizing atmosphere. Yet, because of the first RTA step to diffuse germanium within the second semiconductor layer 46, the second RTO condensation step may be performed with lower thermal budget to thereby help prevent oxidation of the second BOX layer 45.

More particularly, as previously described with reference to FIG. 2 above, a SiGe layer 56 is first formed above the second semiconductor (silicon in the present example) layer 46. However, in this embodiment, the germanium content of the SiGe region may be the same as the final germanium content desired in the second semiconductor layer 46, e.g., 25%. This is because the subsequent RTO processing step may be used to remove the appropriate material thickness without a wet etch, and thus the non-linear germanium profile need not be used to control the etch depth as described above. By way of example, the first RTA step (FIG. 7) may be performed at a temperature of 1050° C. for 50 sec., while the second RTO step (FIG. 8) may be performed at a temperature of 1000° C. for 60 sec., although different temperatures and durations may be used as appropriate in different embodiments. As seen in FIG. 6, the RTO step oxidizes the SiGe layer 56 into an oxide layer 60, which may be removed during further processing steps to provide the structure shown in FIG. 1, as will again be appreciated by those skilled in the art. With this approach, the SiGe oxidation occurs with a lower thermal budget compared to silicon oxidation, which helps prevent oxidation of the second BOX layer 45. This may be done because of the initial germanium diffusion via RTA.

Both of the above-described approaches may advantageously provide for reduced BOX oxidation on PMOS devices, to accordingly help facilitate next generation scaling, such as for UTBB devices, for example. More particularly, scaling of UTBB devices at 14 and 10 nm nodes may potentially be achieved using reduced BOX and channel thickness, which may be particularly beneficial for future CMOS devices. In an example UTBB embodiment, the BOX may be less than about 30 nm, and more particularly about 25 nm. Also by way of example, the semiconductor layer over the BOX may be less than about 10 nm, and more particularly about 7 nm, although other dimensions are also possible in different embodiments.

While silicon and germanium have been described in the illustrated embodiments, other semiconductor materials could also be used. Moreover, in view of the above, it will be appreciated that a variety of different transistor structures may be implemented, including but not necessarily limited to: planar CMOS, high-k metal gate CMOS, PD-SOI, FD-SOI, UTBB, vertical double gate, buried gate, FinFET, tri-gate, multi-gate, 2D, 3D, raised source/drain, strained source/drain, strained channel, and combinations/hybrids thereof, for example.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:
1. A semiconductor device comprising:
a semiconductor substrate;
an n-channel metal-oxide semiconductor field-effect transistor (NMOS) including:
    a first buried oxide (BOX) layer on said semiconductor substrate,
    a first semiconductor layer on said first BOX layer,
    a first pair of source and drain regions in the first semiconductor layer, and an n-type channel in the first semiconductor layer between the first pair of source and drain regions, and
    a first gate above the n-type channel;
a p-channel metal-oxide semiconductor field-effect transistor (PMOS) including:
    a second BOX layer on said semiconductor substrate, the second BOX layer having a thickness that is less than 30 nm,
    a second semiconductor layer on said second BOX layer, the second semiconductor layer including silicon germanium and having a thickness that is less than 10 nm, the second semiconductor layer having a germanium concentration of about 27% at a surface of the second semiconductor layer, and a germanium concentration of about 21% at an interface between the second semiconductor layer and the second BOX layer, a second pair of source and drain regions in the second semiconductor layer, and a p-type channel in the second semiconductor layer between the second pair of source and drain regions, each of the second pair of source and drain regions and the p-type channel including silicon germanium, and a second gate above the p-type channel; and a shallow trench isolation (STI) region between said NMOS and said PMOS, wherein said second BOX layer has a planar upper surface substantially devoid of oxide protrusions adjacent said STI region.

2. The semiconductor device of claim 1 wherein said first semiconductor layer comprises a silicon layer.

3. The semiconductor device of claim 1 wherein the second BOX layer has a substantially uniform thickness.

4. The semiconductor device of claim 1 wherein the first gate comprises a first gate dielectric layer and a first gate electrode layer thereon.

5. The semiconductor device of claim 1 wherein the second gate comprises a second gate dielectric layer and a second gate electrode layer thereon.

6. The semiconductor device of claim 1 further comprising first sidewall spacers adjacent the first gate.

7. The semiconductor device of claim 6 further comprising second sidewall spacers adjacent the second gate.

8. The semiconductor device of claim 7 wherein said first semiconductor layer comprises a silicon layer.

9. A semiconductor device comprising:
a semiconductor substrate;
an n-channel metal-oxide semiconductor field-effect transistor (NMOS) including:
    a first buried oxide (BOX) layer on said semiconductor substrate,
    a first semiconductor layer on said first BOX layer,
    a first source region, a first drain region, and an n-type channel between the first source region and the first drain region, each of the first source region, the first drain region, and the n-type channel positioned in the first semiconductor layer, and
    a first gate above the n-type channel;
a p-channel metal-oxide semiconductor field-effect transistor (PMOS) including:
    a second BOX layer on said semiconductor substrate,
    a second semiconductor layer on said second BOX layer, the second semiconductor layer comprising a layer of silicon germanium having a non-linear diffusion profile of germanium between a surface of the second semiconductor layer and the second BOX layer, the layer of silicon germanium having a germanium concentration of about 27% at the surface of the second semiconductor layer, and a germanium concentration of about 21% at an interface between the second semiconductor layer and the second BOX layer;
    a second source region, a second drain region, and a p-type channel between the second source region and the second drain region, each of the second source region, the second drain region, and the p-type channel positioned in the second semiconductor layer and including silicon germanium having the non-linear diffusion profile, and
    a second gate above the p-type channel; and
an isolation region between said NMOS and said PMOS, said second BOX layer having a substantially uniform thickness and a substantially planar upper surface.

10. The semiconductor device of claim 9 wherein said isolation region comprises a shallow trench isolation region.

11. The semiconductor device of claim 9 wherein said first semiconductor layer comprises a silicon layer.

12. The semiconductor device of claim 9 wherein the first gate comprises a first gate dielectric layer and a first gate electrode layer thereon.

13. The semiconductor device of claim 9 wherein the second gate comprises a second gate dielectric layer and a second gate electrode layer thereon.

14. The semiconductor device of claim 9 further comprising first sidewall spacers adjacent the first gate.

15. The semiconductor device of claim 9 further comprising second sidewall spacers adjacent the second gate.

16. A semiconductor device comprising:
a semiconductor substrate;
an n-channel metal-oxide semiconductor field-effect transistor (NMOS) including:
    a first buried oxide (BOX) layer on said semiconductor substrate,
    a silicon layer on said first BOX layer,
    a first pair of source and drain regions in the silicon layer, and an n-type channel in the silicon layer between the first pair of source and drain regions, and
    a first gate above the n-type channel;
a p-channel metal-oxide semiconductor field-effect transistor (PMOS) including:
    a second BOX layer on said semiconductor substrate, the second BOX layer having a thickness that is less than 30 nm,
    a silicon germanium layer on said second BOX layer, the silicon germanium layer having a germanium concentration of about 27% at a surface of the silicon germanium layer and a germanium concentration of about 21% at an interface between the silicon germanium layer and the second BOX layer, the silicon germanium layer having a thickness that is less than 10 nm,
    a second pair of source and drain regions in the silicon germanium layer, and a p-type channel in the silicon germanium layer between the second pair of source and drain regions, each of the second pair of source and drain regions, and the p-type channel including silicon germanium, and
    a second gate above the p-type channel; and
an isolation region between said NMOS and said PMOS, said second BOX layer having a thickness adjacent the isolation region that is substantially the same as a thickness in a medial portion thereof.

17. The semiconductor device of claim 16 wherein said isolation region comprises a shallow trench isolation region.

18. The semiconductor device of claim 16 wherein the first gate comprises a first gate dielectric layer and a first gate electrode layer thereon.

19. The semiconductor device of claim 16 wherein the second gate comprises a second gate dielectric layer and a second gate electrode layer thereon.

20. The semiconductor device of claim 16 further comprising first sidewall spacers adjacent the first gate.

21. The semiconductor device of claim 16 further comprising second sidewall spacers adjacent the second gate.

* * * * *